United States Patent [19]
Kind et al.

[11] Patent Number: 6,014,725
[45] Date of Patent: Jan. 11, 2000

[54] METHOD OF UP-DATING THE CONTENTS OF THE ELECTRONIC MEMORY OF AN ELECTRONIC APPLIANCE

[75] Inventors: Roland Kind; Frank Westermann, both of Berlin, Germany

[73] Assignee: Siemens Aktiengesellschaft, München, Germany

[21] Appl. No.: 08/981,887

[22] PCT Filed: Jun. 20, 1996

[86] PCT No.: PCT/DE96/01142

§ 371 Date: May 21, 1998

§ 102(e) Date: May 21, 1998

[87] PCT Pub. No.: WO97/02573

PCT Pub. Date: Jan. 23, 1997

[30] Foreign Application Priority Data

Jul. 4, 1995 [DE] Germany ................ 195 25 916

[51] Int. Cl.[7] .................. G06F 12/02; G06F 9/44
[52] U.S. Cl. ............. 711/103; 711/154; 395/712
[58] Field of Search ................. 711/101, 102, 711/103, 154, 165; 395/712

[56] References Cited

U.S. PATENT DOCUMENTS

| | | | |
|---|---|---|---|
| 5,456,692 | 10/1995 | Smith, Jr. et al. | 607/31 |
| 5,623,604 | 4/1997 | Russell et al. | 395/712 |
| 5,630,139 | 5/1997 | Ozaki | 395/712 |
| 5,659,801 | 8/1997 | Kopsaftis | 710/62 |
| 5,778,070 | 7/1998 | Mattison | 380/25 |
| 5,802,268 | 9/1998 | Fisher et al. | 714/25 |
| 5,905,921 | 5/1999 | Miyazawa | 396/300 |

FOREIGN PATENT DOCUMENTS

| | | |
|---|---|---|
| 502 246 | 9/1992 | European Pat. Off. . |
| 654 936 | 5/1995 | European Pat. Off. . |
| 2 531 800 | 2/1984 | France . |
| 03 269633 | 12/1991 | Japan . |

OTHER PUBLICATIONS

"Method of Updating Microcode in a Peripheral System", IBM Technical Disclosure Bulletin, Armonk, New York, USA, vol. 37, No. 3, Mar. 1994, p. 503.

"Downloadsd through Serial Interfaces", Karl Wagner, Design and Electronics, UB/TIB Hannover, No. 12, Jun. 18, 1993, pp. 36–37.

"Initializing RAM Variables", W. Chan, Design and Electronics, UB/TIB Hannover, No. 15, Jul. 16, 1991, pp. 56–58, and 60.

*Primary Examiner*—Eddie P. Chan
*Assistant Examiner*—Kevin L. Ellis
*Attorney, Agent, or Firm*—Kenyon & Kenyon

[57] ABSTRACT

To update the memory contents in an electronic memory formed by an EPROM (4) in an electronic apparatus (5) without hardware measures, communication is initiated between the electronic apparatus (5) and a data processing system (1), whereupon code (6) corresponding to the program code of the apparatus (1) is loaded from the data processing system (1) into a RAM (7) assigned to the EPROM (4) of the electronic apparatus (5). After activating the program code (6) loaded into the RAM (7) and initiating communication between the RAM (7) and the data processing system (1), the EPROM (4) is erased. Then the up-to-date memory contents are loaded from the memory (2) of the data processing system (1) into the EPROM (4) and a reset signal is generated.

2 Claims, 1 Drawing Sheet

METHOD OF UP-DATING THE CONTENTS OF THE ELECTRONIC MEMORY OF AN ELECTRONIC APPLIANCE

FIELD OF THE INVENTION

The invention relates to a method of updating the contents of the electronic memory of an electronic apparatus, where the up-to-date memory contents are transmitted to the memory of the electronic apparatus from a data processing system which has the up-to-date memory contents and is connected to the electronic apparatus via a serial interface.

BACKGROUND INFORMATION

*IBM Technical Disclosure Bulletin*, vol. 37, no. 03, March 1994, page 503 describes a conventional method of updating the erasable programmable read-only memory of an electronic device. With this conventional method, an additional erasable programmable read-only memory module is used which initiates communication with a data processing system connected to it for updating the memory contents of the first erasable programmable read-only memory module. Then a new program code is loaded into a large buffer (which may be RAM) via the additional read-only memory module, and the one read-only memory module is also erased. Then the new program code is loaded from the large buffer into the one read-only memory module.

SUMMARY OF THE INVENTION

An object of the present invention is to provide a method of updating the contents of an electronic memory. The contents of an electronic memory designed as an erasable programmable read-only memory of an electronic apparatus can also be updated.

This object is achieved according to the present invention with a method where program code corresponding to the program code and the program code loaded into the random-access memory are loaded into a random-access memory provided with the erasable programmable read-only memory of the electronic apparatus, and the program code loaded into the random-access memory is activated, thus initiating communication between this memory and the data processing system. Initiation of communication causes the erasable programmable read-only memory to be erased, and the up-to-date memory contents are loaded from the memory of the data processing system into the erasable programmable read-only memory, and the data processing system causes a RESET to occur.

An advantage of the method according to the present invention is that the contents of an erasable programmable read-only memory can be updated with it even when loaded with all or part of the program code of the electronic apparatus. This does not require the replacement of the respective erasable programmable read-only memory in the electronic apparatus, nor is any other hardware measure necessary to update the memory contents in the method according to the present invention.

In an exemplary embodiment of the method according to the present invention, an EPROM with at least one area that can be excluded from erasing is used as the erasable programmable read-only memory, and communication between the EPROM and the data processing system takes place using a subprogram that is stored in the area of the EPROM that can be excluded from erasing. The advantage of this method is that, in a state in which the EPROM has already been erased and the RAM has also been unloaded due to a power failure, for example, communication from the electronic apparatus or the EPROM to the data processing system can be established with the help of the program stored in the area excluded from erasing, so that the method of updating the memory contents of the EPROM can also be readily begun again even in the above-mentioned state of the memory of the electronic apparatus.

DETAILED DESCRIPTION OF THE INVENTION

Figure 1:
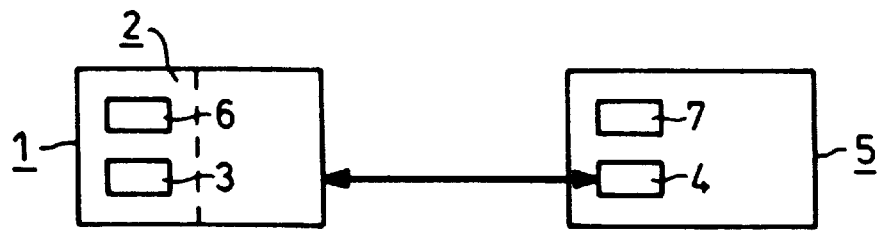
FIGS. 1–6 show a schematic sequence of a method according to the present invention.

FIG. 1 shows a personal computer 1 as the data processing system in whose memory area 2 there is loaded a code 3, among other things, which is provided for reprogramming an erasable programmable read-only memory 4, designed as a flash EPROM, of an electronic apparatus 5; electronic apparatus 5 may be, for example, a protection apparatus for detecting faults in electronic power supply equipment. Memory area 2 of personal computer 1 also contains a random-access memory (RAM) 6. Electronic apparatus 5 is also equipped with a RAM 7. The other electronic parts of electronic apparatus 5, such as a processor, are not shown in FIG. 1 or the following figures.

At the start of the sequence of the method according to the present invention as illustrated in FIG. 1, communication is initiated between personal computer 1 and erasable programmable read-only memory 4 of electronic apparatus 5, wherein electronic apparatus 5 is identified and the baud rate is set.

Figure 2:
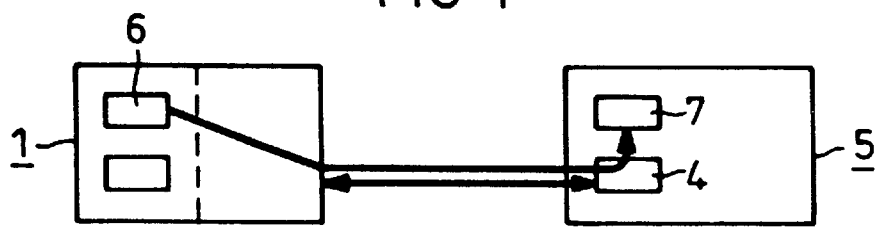

FIG. 2 illustrates how, in the next step after initiating communication, a program code containing the commands for the sequential program of electronic apparatus 5 is loaded from RAM 6 of personal computer 1 into RAM 7 of electronic apparatus 5. A check is also performed.

Figure 3:
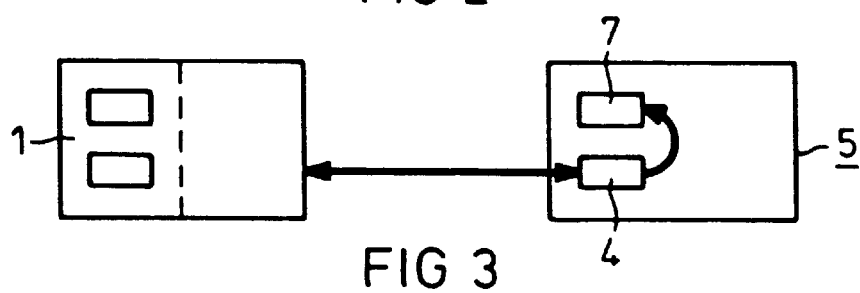
Figure 4:
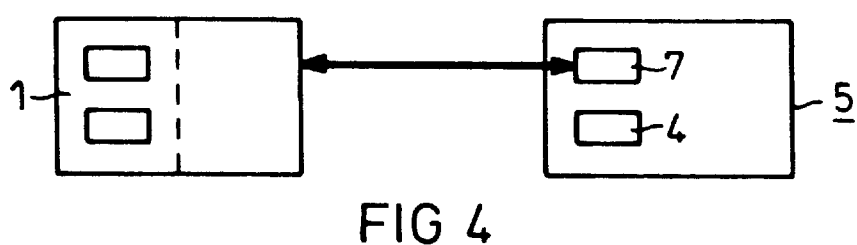

FIG. 3 shows that after loading the program code from RAM 6 of personal computer 1 into RAM 7 of electronic apparatus 5, the code in RAM 7 is activated. Then, as shown in FIG. 4, communication is initiated between RAM 7 of electronic apparatus 5 and personal computer 1, in the course of which a check is performed to determine whether RAM 7 of apparatus 5 has been loaded properly. Once this has been verified, the memory contents of EPROM 4 of electronic apparatus 5 are erased.

Figure 5:
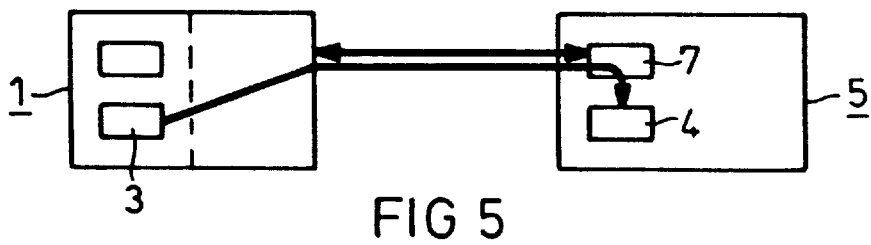

Then, as illustrated in FIG. 5, the up-to-date memory contents or code 3 is loaded from personal computer 1 into EPROM 4 of electronic apparatus 5, so that the storage contents of electronic apparatus 5 are updated with regard to EPROM 4.

Figure 6:
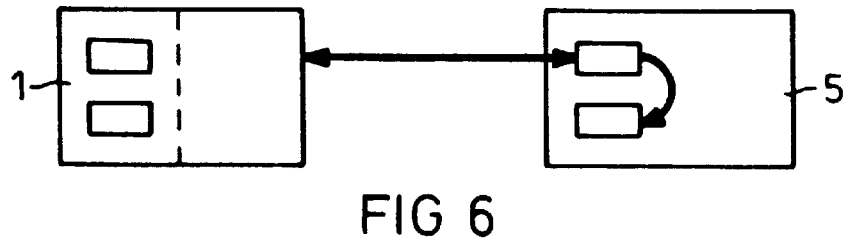

Finally, as shown in FIG. 6, a command from personal computer 1 concludes the updating operation by generating a reset signal.

What is claimed is:

1. A method of updating the contents of an electronic memory device, the electronic memory device being designed as an erasable programmable read-only memory module and containing a stored program code, the method comprising the steps of:

transmitting a program code to the erasable programmable read-only memory module from a data processing system, wherein the data processing system is connected to the electronic memory device by a serial interface and wherein the program code is stored in a memory device of the data processing system;

loading the transmitted program code into a random-access memory assigned to the erasable programmable read-only memory module;

activating the program code loaded into the random-access memory, and initiating communication between the random-access memory and the data processing system;

erasing the erasable programmable read-only memory module;

loading memory contents from the memory device of the data processing system into the erasable programmable read-only memory; and causing a reset of the electronic memory device by a signal from the data processing system.

2. The method according to claim 1, wherein an EPROM is used as the erasable programmable read-only memory, the EPROM including at least one area that can be excluded from erasing, and communication is initiated between the EPROM and the data processing system using a subprogram stored in the at least one area that can be excluded from erasing.

* * * * *